(12) United States Patent
Porter

(10) Patent No.: US 11,056,157 B2
(45) Date of Patent: *Jul. 6, 2021

(54) WEAR LEVELING

(71) Applicant: Micron Technology, Inc., Boise, ID (US)

(72) Inventor: John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/856,562

(22) Filed: Apr. 23, 2020

(65) Prior Publication Data

US 2020/0251154 A1    Aug. 6, 2020

Related U.S. Application Data

(63) Continuation of application No. 15/992,972, filed on May 30, 2018, now Pat. No. 10,636,459.

(51) Int. Cl.
*G11C 7/10* (2006.01)
*G06F 12/02* (2006.01)
*G11C 11/22* (2006.01)

(52) U.S. Cl.
CPC ........ *G11C 7/1042* (2013.01); *G06F 12/0246* (2013.01); *G11C 7/1039* (2013.01); *G06F 2212/7211* (2013.01); *G11C 11/221* (2013.01); *G11C 2207/2236* (2013.01)

(58) Field of Classification Search
None
See application file for complete search history.

(56) References Cited

U.S. PATENT DOCUMENTS

| 10,636,459 | B2 * | 4/2020 | Porter ................. G11C 7/1042 |
| 2008/0082730 | A1 | 4/2008 | Kim et al. |
| 2008/0123423 | A1 | 5/2008 | Kim |
| 2010/0037014 | A1 | 2/2010 | Lim et al. |
| 2010/0308858 | A1 | 12/2010 | Noda et al. |
| 2011/0264859 | A1 | 10/2011 | Yano et al. |
| 2012/0054418 | A1 | 3/2012 | Masuo et al. |
| 2012/0173792 | A1 | 7/2012 | Lassa et al. |
| 2014/0281174 | A1 | 9/2014 | Lee |

(Continued)

FOREIGN PATENT DOCUMENTS

| EP | 2761471 B1 | 10/2017 |
| WO | 2016144726 A1 | 9/2016 |

OTHER PUBLICATIONS

U.S. Appl. No. 15/831,698, entitled "Data Movement Operations in Non-Volatile Memory", filed Dec. 5, 2017, (27 pgs.).

(Continued)

*Primary Examiner* — Nathan Sadler
(74) *Attorney, Agent, or Firm* — Brooks, Cameron & Huebsch, PLLC

(57) ABSTRACT

An apparatus has a controller and an array of memory cells, including a first section comprising a plurality of rows and a second section comprising a plurality of rows. The controller configured to, in association with wear leveling, transfer data stored in a first row of the first section from the first row to a register, transfer the data from the register to a destination row of the second section while data in a second row of the first section is being sensed.

20 Claims, 5 Drawing Sheets

(56) References Cited

U.S. PATENT DOCUMENTS

| 2015/0255159 | A1 | 9/2015 | Tanaka |
| 2016/0092122 | A1 | 3/2016 | Agrawal et al. |
| 2016/0267002 | A1 | 9/2016 | Kanno et al. |
| 2017/0147211 | A1 | 5/2017 | Shiah et al. |
| 2017/0293449 | A1 | 10/2017 | Sunwoo et al. |

OTHER PUBLICATIONS

International Search Report and Written Opinion from related international application No. PCT/US2019/025134, dated Jul. 11, 2019, 16 pages.

Jacob, et al. "Memory Systems: Cache, DRAM, Disk." Elsevier, 2008, pp. 431.

Fujitsu, "FRAM Guide Book", Sep. 2010, 6th edition, https://www.fujitsu.com/downloads/MICRO/fme/fram/fram-guide-book.pdf.

Seshardri, et al. "RowClone: Fast and Energy-Efficient In-DRAM Bulk Data Copy and Initialization", Dec. 2013, ACM, MICRO-46.

\* cited by examiner

WEAR LEVELING

PRIORITY INFORMATION

This application is a continuation of U.S. application Ser. No. 15/992,972, filed on May 30, 2018, the contents of which are incorporated herein by reference.

TECHNICAL FIELD

The present disclosure relates generally to apparatus, such as memories, and their operation, and, more particularly, to memory management.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), ferroelectric random access memory (FeRAM), and magnetoresistive random access memory (MRAM), among others.

Memory cells are often arranged in a memory array. In some examples, the array may be wear leveled, as part of a memory management process, to prevent overuse of portions of the array that could lead to failure of those portions. Wear leveling can extend the useful lifetime of a device by spreading the usage across the various portions of the array (e.g., so that the portions experience similar usage).

DETAILED DESCRIPTION

Figure 1:
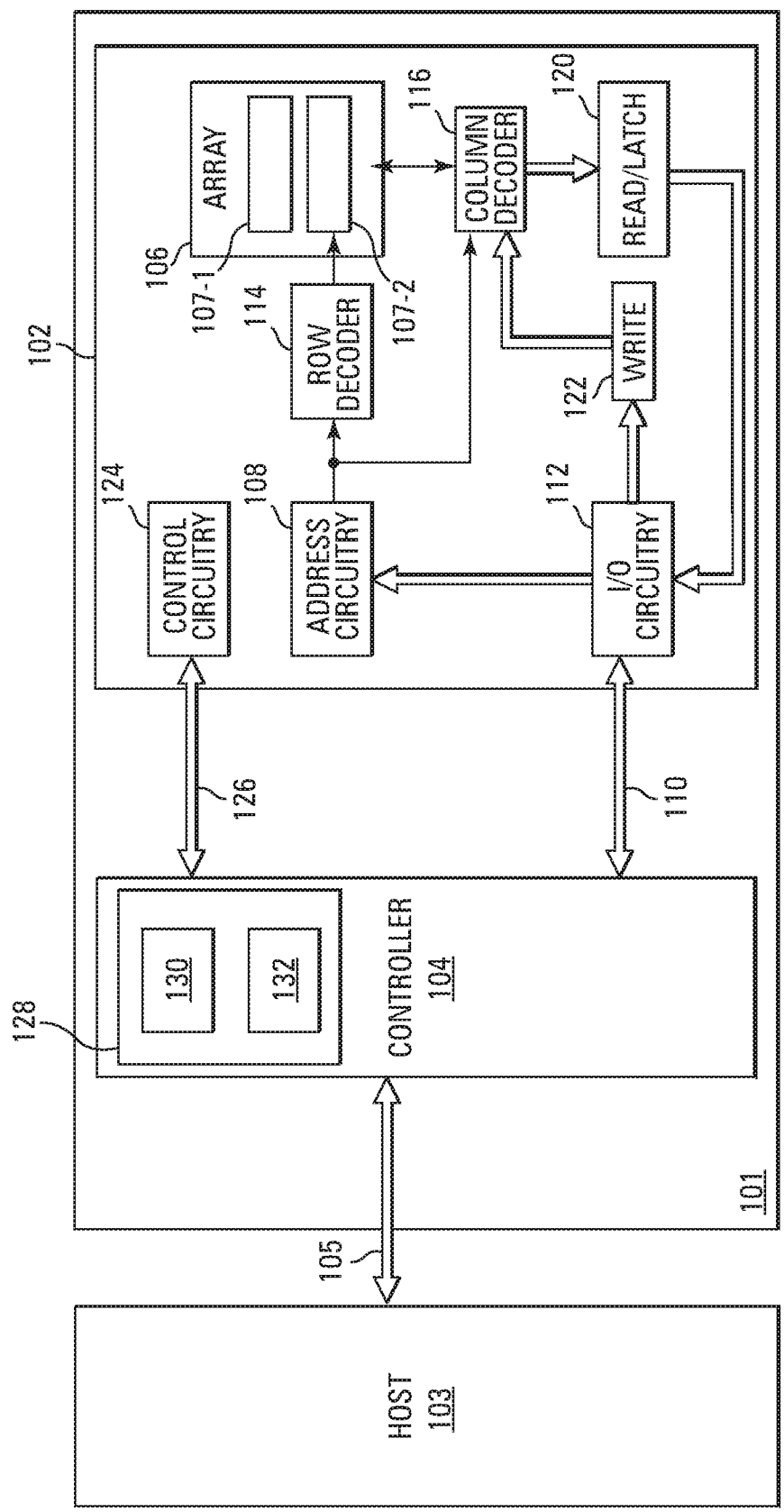
FIG. 1 is a block diagram of an apparatus, in accordance with a number of embodiments of the present disclosure.

The present disclosure is directed to technological improvements in apparatus, such as non-volatile memory (e.g., FeRAM, flash, etc.). For example, the disclosed embodiments reduce the time it takes to perform memory management operations, such as wear leveling operations, compared to previous approaches.

Wear leveling can involve transferring data from source locations (e.g., a source rows) in one section (e.g., a subarray) of a memory array to target locations (e.g., target rows) in another section of the memory array and mapping addresses of the source locations to addresses of the target locations. The source and target rows can be divided into addressable portions, and the data may be transferred from the source row to the target row a portion at time.

In previous approaches, the portions may be transferred one after another in series. For example, the following transfer sequence may be repeated for each portion of each source row: The source row is activated; a portion of the source row is sensed while the source row is activated; the sensed portion of the source row is transferred to a register while the source is activated; the source row is deactivated; the target row is activated; and the portion of the source row is transferred from the register to a portion of the target row while the target row is activated. However, this can be time consuming, and can slow the operation of the memory, especially for examples in which wear leveling is not performed as a background operation.

The present disclosure solves the problems associated with the previous approaches by transferring data from a register to the target row concurrently in parallel with sensing data from a source row while the target row and source row are concurrently activated in parallel. This results in shorter memory management cycle times and wear leveling times, and thus improved memories, compared to previous approaches.

In the following detailed description, reference is made to the accompanying drawings that form a part hereof, and in which is shown, by way of illustration, specific examples. In the drawings, like numerals describe substantially similar components throughout the several views. Other examples may be utilized and structural, logical, and/or electrical changes may be made without departing from the scope of the present disclosure. The following detailed description is, therefore, not to be taken in a limiting sense, and the scope of the present disclosure is defined only by the appended claims and equivalents thereof.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements.

The term coupled may further include two or more elements that co-operate or interact with each other (e.g., as in a cause and effect relationship).

FIG. 1 is a block diagram of an apparatus, such as an electronic system, in accordance with a number of embodiments of the present disclosure. The electronic system includes a memory system, such as a non-volatile memory 101 (e.g., FeRAM, flash, etc.), coupled to a host 103. In some examples, host 103 may be a portion of a computing system, such as in a personal computer, a hand-held device, a cell phone, etc.

Memory 101 includes a memory device 102 and a controller 104, such as a memory controller. Controller 104 might include a processor, for example. Controller 104 may receive command signals (or commands), address signals (or addresses), and data signals (or data) from host 103 over connections 105 and may output data to the host 103 over connections 105.

Memory device 102 may include a memory array 106 of non-volatile memory cells. Memory array 106 may include a ferroelectric memory array, a cross-point memory array, a flash memory array (e.g., a NAND flash memory array), etc. In some examples, memory array 106 is divided into sections, such as subarrays 107-1 and 107-2, but there can more than two subarrays 107, for example. As used herein, a memory (e.g., 101), a controller (e.g., 104), and/or a memory array (e.g., 106) may separately be considered an "apparatus."

Memory device 102 may include address circuitry 108 to latch address signals provided over I/O connections 110 through I/O circuitry 112. Address signals may be received and decoded by a row decoder 114 and a column decoder 116 to access the memory array 106.

Memory device 102 may read data in memory array 106 by sensing voltage and/or current changes in the memory array columns using sense/buffer circuitry that in some examples may be read/latch circuitry 120. Read/latch circuitry 120 may read and latch data from the memory array 106. I/O circuitry 112 may be included for bi-directional data communication over the I/O connections 110 with controller 104. Write circuitry 122 may be included to write data to memory array 106.

Read latch circuitry 120 can include a first register coupled to subarray 107-1. Read latch circuitry 120 can include a second register coupled to subarray 107-2 and the first register. In some examples, data can be transferred from subarray 107-1 (e.g., operating as a source subarray) to the second register via the first register during a memory management operation, such as a wear leveling operation, and held. The data can be transferred from second register to subarray 107-2 (e.g., operating as a destination subarray) during a subsequent wear leveling operation while other data in subarray 107-1 is being sensed, for example. For example, data can be transferred from the second register to a destination row in subarray 107-2 concurrently in parallel with sensing data from a source row in subarray 107-1 while the destination row and source row are concurrently activated in parallel.

Data held in the second register can be output to I/O circuitry 112 during a read operation performed between wear leveling operations. For example, controller 104 might map an address of a row in subarray 107-1 from which data has been transferred to the second register to the second register. In some examples, controller 104 may be configured to transfer data in the second register to a designated row in subarray 107-2 while memory device 102 is being powered down, such as in response to a desired or undesired loss of power.

Control circuitry 124 may decode signals provided by an interface bus 126 from controller 104. These signals may include commands, such as memory management commands from memory management component 128. For example, a memory management command may be (e.g., may include) a wear leveling command from a wear leveling component 130 of memory management component 128. For example, memory device 102 may perform the wear leveling operations disclosed herein in response to the wear leveling commands. Other signals provided by control connections 126 from controller 104 can include chip enable signals, write enable signals, and address latch signals that are used to control the operations on memory array 106, including data read, data write, and data erase operations.

Control circuitry 124 may be included in controller 104, for example. Controller 104 may include, other circuitry, firmware, software, or the like, whether alone or in combination. Controller 104 may be an external controller (e.g., in a separate die from the memory array 106, whether wholly or in part) or an internal controller (e.g., included in a same die as the memory array 106). For example, an internal controller might be a state machine or a memory sequencer. In some examples, where controller 104 might be an internal controller, controller 104 might be part of memory device 102. Controller 104 is configured to perform the methods disclosed herein, such as wear leveling, memory management, and data transfer (e.g., during wear leveling)

In some examples, memory management component 128 includes an address converter, such as a logical-to-physical (L2P) address mapping table 132. For example, table 132 can map logical addresses received from host 103 to physical addresses of locations of groups of memory cells, such as rows, within memory array 106. In some examples, a logical address of a row in subarray 107-1 may be mapped to a row in subarray 107-2 when data from a row in subarray 107-1 is transferred to a row in subarray 107-2 during wear leveling. A logical address of a row in subarray 107-1 may be mapped to a register (e.g., a holding register), which may be part of read/latch circuitry 120, in response to transferring data from that row to the register during a wear leveling operation, for example. As used herein, the term "row" can refer to an access line (e.g., a select line or word line) to which a group of memory cells are commonly coupled and/or to the group of cells themselves (e.g., "a row of cells").

Figure 2:
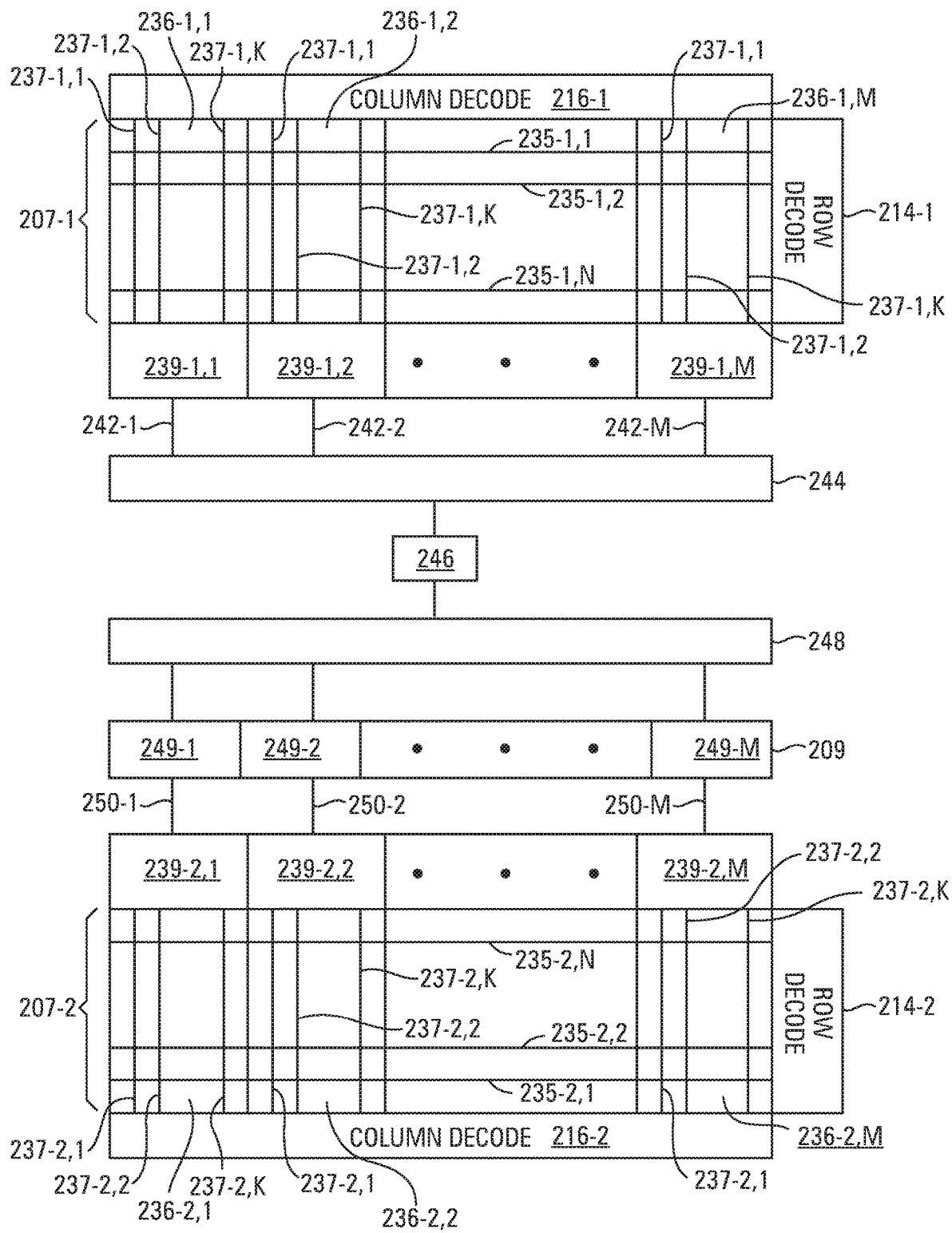
FIG. 2 is a block diagram of portions of a memory array and associated components, in accordance with a number of embodiments of the present disclosure.

FIG. 2 is a block diagram of portions of a memory array, such as memory array 106, and associated components, in accordance with a number of embodiments of the present disclosure. FIG. 2 includes subarrays 207-1 and 207-2 that can be subarrays of memory array 106. For example, subarray 207-1 may act as a source subarray and subarray 207-2 as a target subarray during example wear leveling operations. A row decoder 214-1 is coupled to rows 235-1,1 to 235-1,N of memory cells of section 207-1, and a row decoder 214-2 is coupled to rows 235-2,1 to 235-2,N of memory cells of section 207-2. Row decoders 214-1 and 214-2 can be included in row decoder 114, for example. Rows 235-1,1 to 235-1,N can be source rows, and 235-2,1 to 235-2,N can be target rows during example wear leveling operations.

The rows in subarrays 207-1 and 207-2 include a number of addressable portions corresponding to addressable segments that can be referred to as columns. For example, respective portions of each of rows 235-1,1 to 235-1,N may correspond to respective segments, such as columns 236-1,1 to 236-1,M, and respective portions of each of rows 235-2,1 to 235-2,N may correspond to respective segments, such as columns 236-2,1 to 236-2,M. Columns 236-1,1 to 236-1,M may each have a different address, and columns 236-2,1 to 236-2,M may each have a different address. Columns 236-1,1 to 236-1,M are coupled to column decoder 216-1, and columns 236-2,1 to 236-2,M are coupled to column decoder 216-2. Column decoders 216-1 and 216-2 can be can be included in column decoder 116, for example.

Each of columns 236-1,1 to 236-1,M includes sub-columns 237-1,1 to 237-1,K of memory cells, and each of columns 236-2,1 to 236-2,M includes sub-columns 237-2,1 to 237-2,K of memory cells. A memory cell can be located at each intersection of a row and a sub-column, for example. Columns 236-1,1 to 236-1,M are respectively coupled to (e.g., digit) sense components 239-1,1 to 239-1,M, and columns 236-2,1 to 236-2,M are respectively coupled to sense components 239-2,1 to 239-2,M. For example, each of sense components 239-1,1 to 239-1,M can include respective (e.g., digit) sense amplifiers (not shown in FIG. 2) coupled to respective sub-columns of sub-columns 237-1,1 to 237-1-M, and each of sense components 239-2,1 to 239-2,M can include respective (e.g., digit) sense amplifiers (not shown in FIG. 2) coupled to respective sub-columns of sub-columns 237-2,1 to 237-2-M.

Sets of lines 242-1 to 242-M respectively couple sense components 239-1,1 to 239-1,M to inputs of a multiplexer 244. For example, the lines in each set of lines 242 are respectively coupled to sense amplifiers respectively coupled to sub-columns 237-1,1 to 237-1-M. As such, sets of lines 242-1 to 242-M respectively couple columns 236-1,1 to 236-1,M to multiplexer 244. The output of multiplexer 244 is coupled to an input of a (e.g., non-volatile) register 246, such as a data sense component, that can be a portion of register 146. For example, multiplexer 244 is configured to selectively couple columns 236-1,1 to 236-1,M to register 246 individually, so that one of columns 236-1,1 to 236-1,M at a time is coupled to register 246. As such, multiplexer 244 is configured to selectively couple respective portions of a selected row of sub-array 207-1, that correspond respective columns 236-1,1 to 236-1,M, to register 246 individually.

An output of register 246 is coupled to an input of a multiplexer 248. Multiplexer 248 is coupled to a (e.g., non-volatile) register 209, which can serve as a holding register. For example, read/latch circuitry 120 can include register 209, so that register 209 may be coupled to I/O circuitry 112. Register 209 may include segments 249-1 to 249-M. In some examples, segments 249-1 to 249-M may be referred to as registers 249-1 to 249-M.

Multiplexer 248 is configured to selectively couple register 246 to segments 249-1 to 249-M one at a time. For example, segments 249-1 to 249-M respectively hold data received individually at register 246 from respective portions of a selected row of sub-array 207-1 that correspond to respective columns 236-1,1 to 236-1,M. Note that the data width of register 246 may be the same as the data width of each of columns 236-1,1 to 236-1,M, and the data width of each of segments 249-1 to 249-M may be the same as the data width of each of columns 236-1,1 to 236-1,M. Register 209 may have the same data width as a row 235 in either of subarrays 207-1 or 207-2 and may hold a row of data. For example, register 246 and each of segments 249-1 to 249-M may have the same data width as a portion of a row 235 corresponding to one of columns 236, for example.

Segments 249-1 to 249-M are respectively coupled to sense components 239-2,1 to 239-2,M by sets of lines 250-1 to 250-M. For example, segments 249-1 to 249-M are respectively coupled to columns 236-2,1 to 236-2,M and thus the portions of the rows 235-2 corresponding to columns 236-2,1 to 236-2,M.

In operation, row 235-1,1 may be selected (e.g., opened) in response to a wear leveling command from wear leveling component 132 that addresses row 235-1,1. Row 235-1,1 may be activated (e.g., fired), for example. Data may be transferred from respective portions of row 235-1,1, corresponding to the respective columns 236-1,1 to 263-1,M, one portion at a time to register 246 via multiplexer 244. The respective portions of data may then be transferred to segments 249-1 to 249-M via multiplexer 248 and held.

Rows 235-1,2 and 235-2,1 may be activated concurrently (e.g., in parallel) in response to a subsequent wear leveling command from wear leveling component 132 that addresses row 235-1,2, and data in the portion of row 235-1,2 corresponding to column 236-1,1 may be transferred to register 246 via multiplexer 244 while data from segment 249-1 is transferred to the portion of row 235-2,1 corresponding to column 236-2,1. The data in register 246 may then be transferred to segment 249-1 while data from segment 249-2 is transferred to the portion of row 235-2,1 corresponding to column 236-2,2.

In some examples, the data from segment 249-1 may be transferred to the portion of row 235-2,1 corresponding to column 236-2,1 while the data in the portion of row 235-1,2 corresponding to column 236-1,1 is being sensed by sense component 239-1,1. In other examples, row 235-2,1 may be pre-charged while sensing the data in the portion of row 235-1,2. For example, pre-charging a row may be performed prior to activating the row (e.g., after deactivating a preceding row) to get the row ready for activation.

Figure 3A:
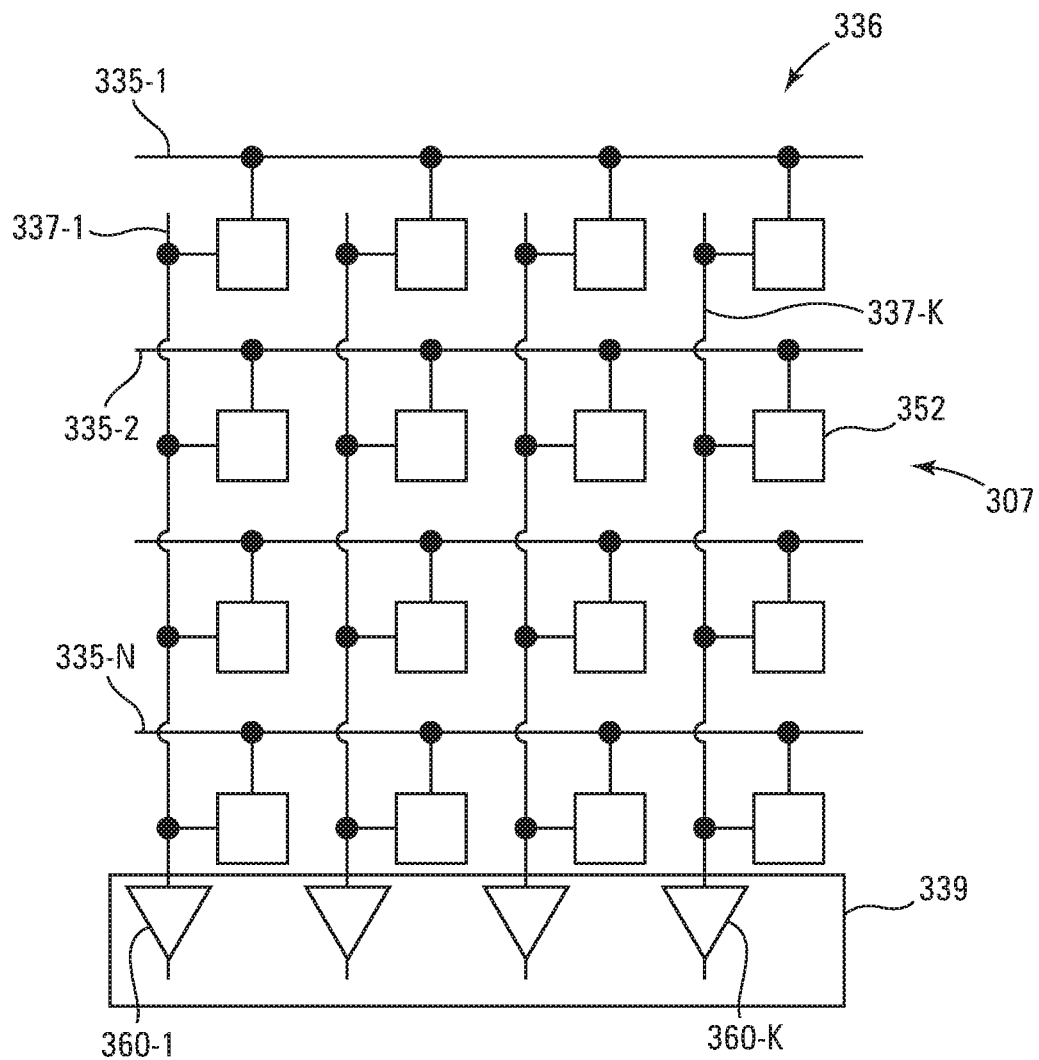
FIG. 3A illustrates an example of a portion of a memory array, in accordance with a number of embodiments of the present disclosure.

FIG. 3A illustrates an example of a portion of a memory array, in accordance with a number of embodiments of the present disclosure. For example, the array portion shown in FIG. 3A can be a column 336 of a subarray 307 of an array of ferroelectric memory cells 352. The subarray 307 can be a subarray such as subarray 207-1 and subarray 207-2, and column 336 can be a column such as column 236 shown in FIG. 2. The column 336 is coupled to a sense component 339, which can be analogous to sense components 239 shown in FIG. 2.

Column 336 includes memory cells 352 that may be programmable to store different states. A memory cell 352 may include a capacitor to store a charge representative of the programmable states. For example, a charged and uncharged capacitor may respectively represent two logic states (e.g., a logical one "1" or logical zero "0"). Memory cell 352 includes a capacitor with a ferroelectric material, in some examples. For example, ferroelectric materials may have a spontaneous electric polarization (e.g., they may have a non-zero polarization in the absence of an electric field). Different levels of charge of a ferroelectric capacitor may represent different logic states, for example.

A memory cell 352 is coupled to a respective access line, such as a respective one of access lines 335-1 to 335-N, and a respective data (e.g., digit) line, such as one of data lines 337-1 to 337-K. For example, a memory cell 352 may be coupled between an access line 335 and a data line 337. In some examples, access lines 335 may also be referred to as word lines, and data lines 337 may also be referred to as bit lines.

The memory cells commonly coupled to access lines 335-1 to 335-N form portions of respective rows 335-1 to 335-N (e.g., rows 235-1,1 to 235-1,N).

Memory cells commonly coupled to a data line 337 can be referred to as a sub-column of memory cells. The memory cells commonly coupled to data lines 337-1 to 337-K respectively form sub-columns 337-1 to 337-K. For example, sub-columns 237-1,1 to 237-1,K may be respectively configured as sub-columns 337-1 to 337-K, and sub-columns 237-2,1 to 237-2,K may be respectively configured as sub-columns 337-1 to 337-K. For example, data lines 337-1 to 337-K may be coupled to a column decoder, such as column decoder 216-1 or column decoder 216-2. In some examples, sub-columns 337-1 to 337-K form a column, such as a column 236 in FIG. 2. For example, a column can be defined as a number of commonly addressed data lines.

Sense component 339 includes sense amplifiers 360-1 to 360-K respectively coupled to data lines 337-1 to 337-K and sub-columns 337-1 to 337-K. Data may be sensed from the memory cells 352 in the portion of a row, such as a portion of row 335-1, by activating row 335-1 (e.g., by applying a voltage to the corresponding access line). The data in the memory cells in the portion of the row may be sensed by sense amplifiers 360-1 to 360-K, and thus sense component 339. Sensed data can be sent from sense amplifiers 360-1 to 360-K (e.g., sense component 339) to register 246 via multiplexer 248 in response to activating (e.g., firing) sense amplifiers 360-1 to 360-K with control signals from control circuitry, such as control circuitry 124.

To write data to a portion of row 335-1, the data may be sent to sense amplifiers 360-1 to 360-K from a corresponding segment of a register (e.g., register 209). The data in sense amplifiers 360-1 to 360-K may be written to the portion of row 335-1 by activating the corresponding access line.

Figure 3B:
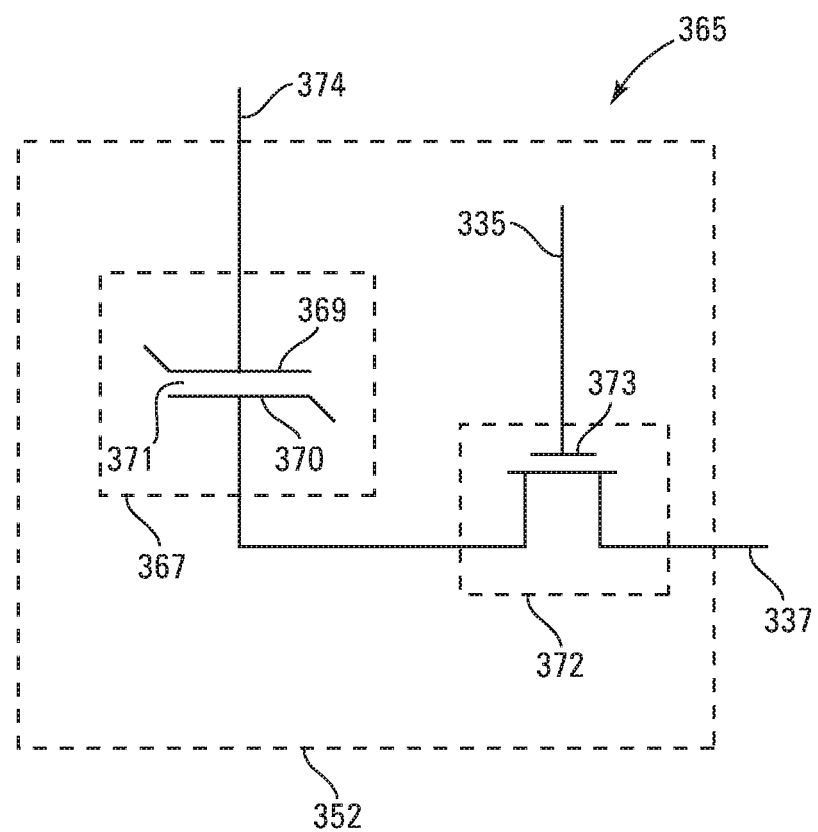
FIG. 3B illustrates an example of a memory cell, in accordance with a number of embodiments of the present disclosure.

FIG. 3B illustrates an example circuit 365 that includes a ferroelectric memory cell 352, in accordance with a number of embodiments of the present disclosure. Circuit 365 also includes an access line 335 and a data line 337. Memory cell 352 may include a logic storage component, such as capacitor 367 that may have a first plate, such as a cell plate 369, and a second plate, such as a cell bottom 370. Cell plate 369 and cell bottom 370 are capacitively coupled through a ferroelectric material 371 positioned between them. The orientation of cell plate 369 and cell bottom 370 may be flipped without changing the operation of memory cell 352.

Circuit 365 may include a select device 372, such as a select transistor. For example, the control gate 373 of select device 372 may be coupled to access line 335. In the example of FIG. 3B, cell plate 369 may be accessed via plate line 374, and cell bottom 370 may be accessed via data line 337. For example, select device 372 may be configured to selectively couple data line 337 to cell bottom 370 in response to access line 335 activating select device 372. For example, capacitor 367 may be electrically isolated from data line 337 when select device 372 is deactivated, and capacitor 367 may be electrically coupled to data line 337 when select device 372 is activated. Activating select device 372 may be referred to as selecting memory cell 352, for example. As previously described, various states may be stored by charging or discharging capacitor 367.

Memory cell 352 can be programmed such that capacitor 367 is in one of a positive polarization state (e.g., corresponding to a "0") or a negative polarization state (e.g., corresponding to a "1"). Memory cell 352 can be sensed by applying a voltage, such as a positive voltage (e.g., a power supply voltage Vdd), to plate line 374, and thus cell plate 369, while applying an activation voltage to access line 337 to activate select device 372, thereby coupling cell bottom 370 to data line 337 that can be floating. A sense amplifier, such as a sense amplifier 360, can compare a resulting voltage on data line 337 to a reference voltage. For example, if the voltage on data line is greater than the reference voltage, capacitor 367 is in a negative polarization state, and a corresponding "1" can be sent from the sense amplifier. If the voltage on data line is less than the reference voltage, for example, capacitor 367 is in a positive polarization state, and a corresponding "0" can be sent from the sense amplifier. However, the reading process can overwrite memory cell 352, destroying its original data. As such, memory cell 352 might need to be rewritten in a write-back process that can be similar to refreshing a DRAM cell.

To write a "0" to memory cell 352, for example, plate line 374, and thus cell plate 369, can be grounded while applying an activation voltage to access line 337 to activate select device 372 to couple a positive voltage applied to data line 337 to cell bottom 370. To write a "1" to memory cell 352, for example, a positive voltage can be applied to plate line 374, and thus cell plate 369, while applying an activation voltage to access line 337 to activate select device 372 to couple grounded data line 337, and thus ground, to cell bottom 370. Alternatively, to write a "1" to memory cell 352, for example, plate line 374, and thus cell plate 369, can be grounded while applying an activation voltage to access line 337 to activate select device 372 to couple a negative voltage applied to data line 337 to cell bottom 370.

In some examples, portions of a row of memory cells can be read as previously described, meaning that the original data stored in the portions can be destroyed and might need to be rewritten. For example, the row may be sensed and "1s" may be written back to the row, as previously described, while the row is activated (e.g., the row is high). For example, the row can be high for a time tRAS. Subsequently, "0's" can be written back, as previously described, to any memory cells in the row that were previously "0s." The row may be pre-charged, and there can be a delay between deselecting a previous row and selecting row before writing back to the row. The sum of delay time and the pre-charge time can be referred to as tRP. In some examples, a time tMM can be the sum of tRAS and tRP and can be analogous to the refresh time for DRAM.

Figure 4A:
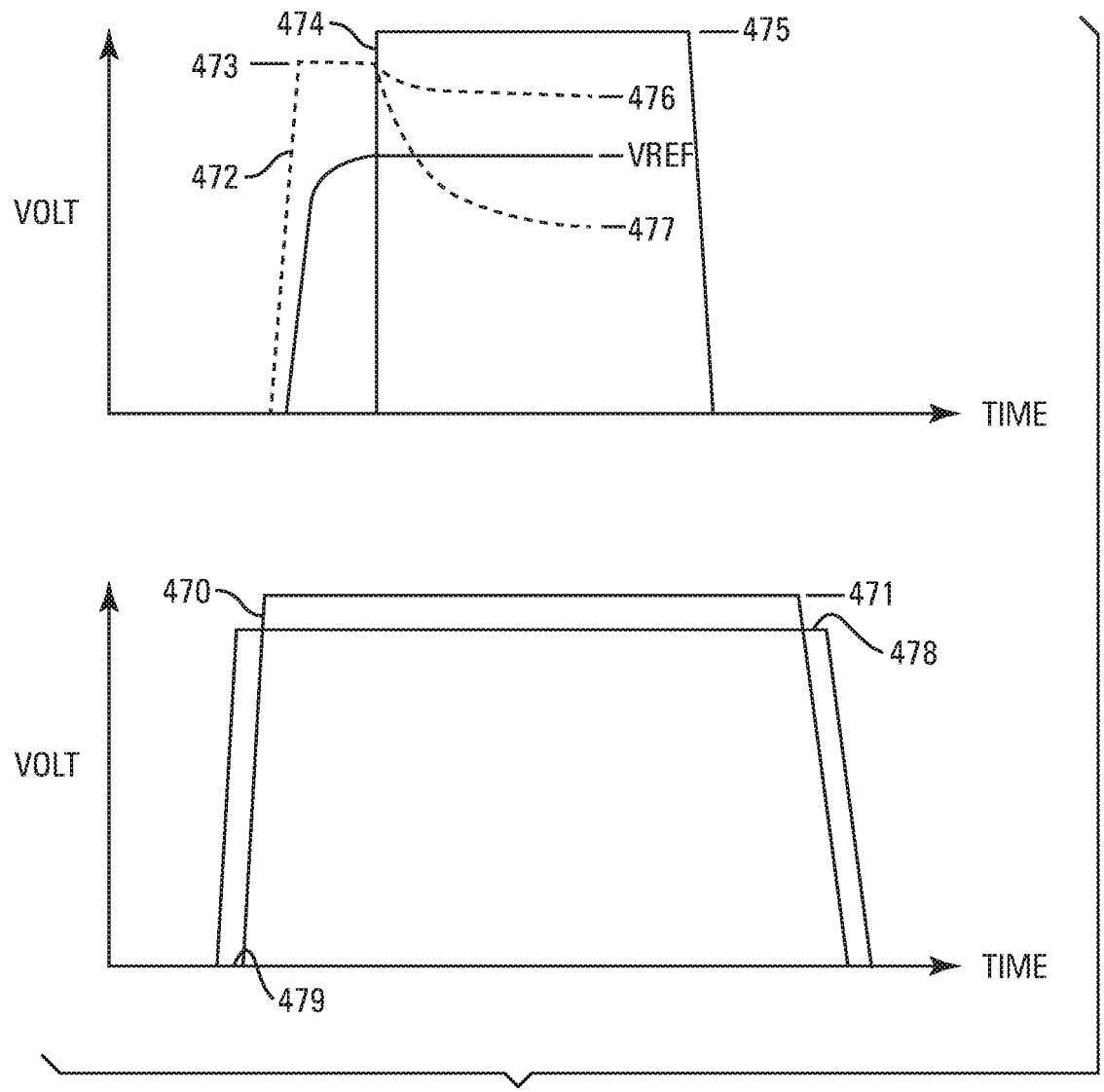
FIG. 4A illustrates signals applied to a memory array during the transfer of data within the array, in accordance with a number of embodiments of the present disclosure.
Figure 4B:
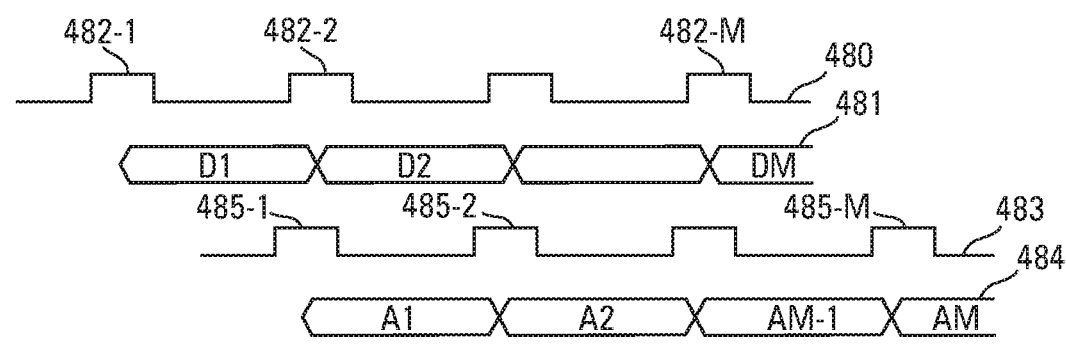
FIG. 4B illustrates data signals and associated control signals during the transfer of data within a memory array, in accordance with a number of embodiments of the present disclosure.

FIG. 4A illustrates signals applied to a memory array during the transfer of data within the array, in accordance with a number of embodiments of the present disclosure. FIG. 4B illustrates data signals and associated control signals during the transfer of data within the array, in accordance with a number of embodiments of the present disclosure. For example, FIGS. 4A and 4B illustrate concurrent data transfer from row 235-1,2 of subarray 207-1 to register 209 and from register 209 to row 235-2,1 of subarray 201-2, for example, during a wear leveling operation performed during a memory management operation in response to a memory management (e.g., wear leveling) command. The data is transferred from row 235-1,2 of subarray 207-1 to register 209 and from register 209 to row 235-2,1 of subarray 201-2 in parallel, for example. The data being transferred from register 209 to row 235-2,1 could have been transferred previously from row 235-1,2 of subarray 207-1 to register 209, for example, during a previous wear leveling operation in response to a previous wear leveling command.

The upper diagram in the example of FIG. 4A is associated with data transfer from row 235-1,2 to register 209, such as during a time tRAS, and the lower diagram in the example of FIG. 4A is associated with data transfer from register 209 to row 235-2,1, such as during a time tRP.

The upper diagram in FIG. 4A is associated with sensing data from row 235-1,2, such as described previously. For example, the data in row 235-1,2 can be destroyed during sensing. The lower diagram in FIG. 4A is associated with writing data from register 209 to row 235-2,1 and can be analogous to the write-back of "1s" and "0s" as previously described. For example, the data is written to row 235-2,1 instead of writing the data back to row 235-1,2. In previous approaches, the sensing associated with the upper diagram and the write-back associated with the lower diagram are performed sequentially in series. For example, tRAS and tRP run sequentially in series so that the time tMM is the sum of tRAS and tRP. However, in FIG. 4A, the sensing and the write-back are performed concurrently in parallel, thereby reducing tMM. For example, tRAS and tRP can run concurrently in FIG. 4A.

The write back can include applying a write voltage 478 to sub-columns of the sub-columns 237-2,1 to 237-2,K of columns 236-2,1 to 236-2,M to write a logic 1, for example. The write back can include applying a write voltage 479 (e.g., about zero volts) to sub-columns of the sub-columns 237-2,1 to 237-2,K of columns 236-2,1 to 236-2,M to write a logic 0, for example. A voltage of a signal 470 that is applied to row 235-2,1 is increased (e.g., from zero volts) to a voltage level 471 to activate row 235-2,1 while write voltages 478 and/or 479 are applied. Although voltages 478 and 479 are described as respectively writing logic 1s and logic 0s, voltages 478 and 479 can respectively write logic 0s and logic 1s in other examples.

While row 235-2,1 is activated, sensing voltage signals 472 applied to the sub-columns 237-1,1 to 237-1,K of each of columns 236-1,1 to 236-1,M may be increased to a voltage level 473. While row 235-2,1 is activated and the voltage signal 472 is at voltage level 473, a voltage of a signal 474 that is applied to row 235-1,2 is increased (e.g., from zero volts) to a voltage level 475 to activate row 235-1,2 so that rows 235-1,2 and 235-2,1 are active concurrently in parallel. In response to activating row 235-1,2, the voltages of voltage signals 472 go to a voltage level 476 that is greater than a reference voltage VREF to sense a logic 1, for example, and to store the logic 1 in register 209 and/or to a voltage level 477 that is less than reference voltage VREF to sense a logic 0, for example, and to store the logic 0 in register 209. Although voltage levels 476 and 477 are described as respectively corresponding to logic 1s and logic 0s, voltage levels 476 and 477 can respectively correspond to logic 0s and logic 1s in other examples.

Control signal 480 in FIG. 4B can be applied to the sense components 239-2,1 to 239-2,M, and data signal 481 corresponds to data being transferred from register 209 to row 235-2,1 while row 235-2,1 is activated. For example, data D1 to DM, of a row of data, respectively in segments 249-1 to 249-M of register 209 may be respectively transferred to sense components 239-2,1 to 239-2,M respectively in response to activation pulses 482-1 to 482-M of control signal 481. For example, activation pulses 482-1 to 482-M may respectively activate sense components 239-2,1 to 239-2,M. Data D1 to DM may be respectively transferred to portions of row 235-2,1 respectively corresponding to columns 236-2,1 to 236-2,M respectively from sense components 239-2,1 to 239-2,M.

Control signal 483 in FIG. 4B can be applied to the sense components 239-1,1 to 239-1,M, and data signal 484 corresponds to data being transferred from row 235-1,2 to register 209 via register 246 while row 235-1,2 is activated. For example, data A1 to AM, of a row of data, respectively corresponding to columns 236-1,1 to 236-1,M may be respectively transferred to sense components 239-1,1 to 239-1,M respectively in response to activation pulses 485-1 to 485-M of control signal 483. For example, activation pulses 485-1 to 485-M may respectively activate sense components 239-1,1 to 239-1,M.

In some examples, data D1 is transferred from segment 249-1 to the portion of row 235-2,1 corresponding to column 236-2,1 in response to activating row 235-2,1. Data D2 is then transferred from segment 249-2 to the portion of row 235-2,1 corresponding to column 236-2,2 while row 235-2,1 remains activated and while data A1 is transferred from the portion of row 235-1,2 corresponding to column 236-1,1 to segment 249-1 in response to activating row 235-1,2.

The transfer of data D2 to data DM from resister 209 to row 235-2,1 respectively concurrently with the transfer of data A1 to data AM-1 from row 235-1,2 to register 209 can continue until data DM is transferred. Data AM is then transferred to segment 249-M so that segments 249-1 to 249-M respectively contain data A1 to data AM respectively from the portions of row 235-1,2 respectively corresponding to columns 236-1,1 to 236-1,M. In some examples, each of data A1 to data AM-1 may be sensed by a respective sense component 239-1 in response to a respective activation pulse 485, sent to register 246, and sent from register 246 to a respective segment 249 while rows 235-2,1 and 235-1,2 are currently activated and while data is sent from a segment 249 to row 235-2,1. The controller 104 can also be configured to perform an error correction operation, using an error correction code (ECC), on data A1 to data AM while it is being transferred from row 235-1,2 to register 209, such as while data A1 to data AM is being transferred from register 246 to register 209, for example.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
 a controller configured to:
  in response to a wear leveling command associated with a wear leveling operation, cause first data stored in a first row of a first array of memory cells of a memory device to be transferred to a register of the memory device without communicating the first data off the memory device; and
  in response to a subsequent wear leveling command associated with the wear leveling operation, cause the first data to be transferred from the register to a row of a second array of memory cells of the memory device while second data stored in a second row of the first array of memory cells is being sensed and without communicating the first data and the second data off the memory device.

2. The apparatus of claim 1, wherein the controller is further configured to, in connection with the wear leveling operation, concurrently and in parallel:
 activate the second row of the first array of memory cells and the row of the second array of memory cells; and transfer the first data from the register to the row of the second array of memory cells while the second data is being sensed.

3. The apparatus of claim 1, wherein the second data is destroyed as a result of the second data row being sensed.

4. The apparatus of claim 1, wherein the controller is further configured to, in connection with the wear leveling operation, transfer respective portions of the first data to respective segments of the register.

5. The apparatus of claim 1, wherein the controller is further configured to, in connection with the wear leveling operation, transfer portions of the first data from respective segments of the register to respective portions of the row of the second array of memory cells.

6. The apparatus of claim 1, wherein the controller is further configured to, in connection with the wear leveling operation, transfer the first data from the register to sense amplifiers coupled to the row of the second array of memory cells.

7. A system, comprising:
  a memory device, comprising:
    a first array of memory cells;
    a second array of memory cells; and
    a register coupled to the first and second arrays of memory cells; and
  a controller coupled to the memory device and configured to:
    in response to a wear leveling command, transfer first data stored in a first row of the first array of memory cells to the register without transferring the first data off the memory device;
    in response to a subsequent wear leveling command, transfer, in parallel:
      second data stored in a second row of the first array of memory cells to the register without transferring the second data off the memory device; and
      the first data from the register to a row of the second array of memory cells without transferring the first data off the memory device.

8. The system of claim 7, wherein the controller is further configured to activate, in parallel:
  the row of the second array of memory cells to transfer the first data from the register to the row of the second array of memory cells; and
  the second row of the first array of memory cells to transfer the second data to the register.

9. The system of claim 7, wherein the register comprises a first register and a second register, and
  wherein the controller is further configured to:
    in response to the wear leveling command:
      transfer a first portion of the first data to the first register without storing the first data in the controller; and
      transfer a second portion of the first data from the first register to a second register;
    in response to the subsequent wear leveling command, transfer, in parallel:
      a first portion of the second data to the first register without storing the first portion of the second data in the controller; and
      a second portion of the second data from the second register to the row of the second array of memory cells without storing the second portion of the second data in the controller.

10. The system of claim 9, wherein the controller is further configured to transfer, in parallel:
  the second data to the second register; and
  the first data from the second register to the row of the second array of memory cells.

11. The system of claim 7, wherein the controller is further configured to pre-charge the row of the second array of memory cells in parallel with sensing of the second data.

12. The system of claim 7, wherein the controller is further configured to correct the first data using an error correction code before transferring the first data to the second register.

13. A method, comprising:
  in response to a wear leveling command:
    transferring data stored in a first row of a first array of memory cells of a memory device to a first register without transferring the data off the memory device; and
    transferring the data from the first register to a second register without transferring the data off the memory device; and
  in response to a subsequent wear leveling command, transferring, in parallel:
    the data from the second register to a row of a second array of memory cells of the memory device without transferring the data off the memory device; and
    data stored in a second row of the first array of memory cells to the first register without transferring the data off the memory device.

14. The method of claim 13, further comprising, transferring, in parallel:
  a portion of the data accessed from the second row of the first array of memory cells from the first register to a respective segment of the second register from which a respective portion of the data accessed from the first row of the first array of memory cells was transferred; and
  another portion of the data accessed from the first row of the first array of memory cells from the second register to a respective portion of the row of the second array of memory cells.

15. The method of claim 13, further comprising transferring respective portions of the data accessed from the first row of the first array of memory cells to the first register such that only one of the respective portions is stored in the first register at a moment of time.

16. The method of claim 15, wherein each of the respective portions correspond to a different address of the first array of memory cells.

17. The method of claim 13, further comprising, in response to a read command addressing the first row of the first array of memory cells, transferring data stored in the second register to input/output circuitry.

18. The method of claim 13, further comprising:
  sensing a portion of the second data with a sense component coupled to a corresponding portion of the second row; and
  transferring the sensed portion of the second data from the sense component to the first register.

19. The method of claim 18, further comprising concurrently and in parallel:
  pre-charging the row of the second array of memory cells; and
  sensing the portion of the second data from the second row of the first array of memory cells.

20. The method of claim 13, further comprising transferring a respective portion of the first data from the second register to a respective sense component coupled to a respective portion of the row of the second array of memory cells.

\* \* \* \* \*